United States Patent [19]

Iida et al.

[11] Patent Number: 4,752,654
[45] Date of Patent: Jun. 21, 1988

[54] INTERMETALLIC COMPOUND-BASED, COMPOSITE SUPERCONDUCTOR

[75] Inventors: Fumio Iida; Naofumi Tada, both of Hitachi, Japan

[73] Assignee: Hitachi, Ltd., Tokyo, Japan

[21] Appl. No.: 924,772

[22] Filed: Oct. 30, 1986

[30] Foreign Application Priority Data

Oct. 30, 1985 [JP] Japan .................. 60-241476

[51] Int. Cl.$^4$ .................................... H01B 12/00
[52] U.S. Cl. ....................... 174/128 S; 29/599; 174/15 S; 174/126 S
[58] Field of Search ............ 174/128 S, 126 S, 15 S; 29/599

[56] References Cited

U.S. PATENT DOCUMENTS

| | | | |
|---|---|---|---|
| 3,958,327 | 5/1976 | Marancik et al. | 174/126 S X |
| 3,996,661 | 12/1976 | Ziegler et al. | 174/126 S X |
| 4,094,060 | 6/1978 | Madsen et al. | 174/126 S X |
| 4,205,119 | 5/1980 | Young et al. | 174/128 S X |
| 4,329,539 | 5/1982 | Tanaka et al. | 174/128 S |
| 4,330,347 | 5/1982 | Hirayama et al. | 174/128 S X |

FOREIGN PATENT DOCUMENTS

| | | |
|---|---|---|
| 191208 | 10/1984 | Japan . |
| 191213 | 10/1984 | Japan . |
| 1586815 | 3/1981 | United Kingdom . |

OTHER PUBLICATIONS

Asner A.; Neue Filamentierte $Nb_3Sn$, Hochfeld-Supraleiter; Bulletin SEV/VSE (ASE/UCS); vol. 68, No. 10; May 14, 1977; Zurich; pp. 484–488.

*Primary Examiner*—Morris H. Nimmo
*Attorney, Agent, or Firm*—Antonelli, Terry & Wands

[57] ABSTRACT

The present invention provides an intermetallic compound-based, composite superconductor suitable for use in superconducting coils for a high magnetic field, where the superconductive part is formed by thermal diffusion reaction, and which has such a structure that a metal layer of high melting point and high resistance is provided at the outermost periphery of a strand comprising a plurality of filaments containing a superconductive compound formed by diffusion reaction with the surrounding matrix, a stabilizer surrounding the matrix, and a diffusion barrier provided between the stabilizer and the matrix for preventing diffusion of superconductive compound-forming element in the matrix from diffusion into the stabilizer during the diffusion reaction, and the coupling current induced between the intermetallic compound-based superconductive wire members can be reduced by the provision of the metal layer of high melting point and high resistance. Furthermore, the superconductive parts can be formed by heat treatment, and the AC loss can be reduced thereby.

6 Claims, 1 Drawing Sheet

INTERMETALLIC COMPOUND-BASED, COMPOSITE SUPERCONDUCTOR

BACKGROUND OF THE INVENTION

This invention relates to an intermetallic compound-based, composite superconductor, and more particularly to an intermetallic compound-based, composite superconductor suitable for use in superconducting coils, etc. for generating a high magnetic field, where the superconductive part is formed by a thermal diffusion reaction.

Superconducting coils for use in a nuclear fusion reactor utilize an intermetallic compound-based superconductor having distinguished high magnetic field characteristics as a conductor owing to the necessity for generating a high magnetic field. According to the most popular structure of an intermetallic compound-based composite superconducting wire member, a large number of filaments are evenly distributed and contained in a matrix. The filaments contain a superconductive compound formed by diffusion reaction of the element in the filaments with the element in the matrix through a high temperature heat treatment, such as niobium-tin ($Nb_3Sn$), etc., and diffusion barriers are provided around the matrix to prevent a portion of the superconductive compound-forming element in the matrix from diffusion into a stabilizer during the thermal diffusion reaction.

According to other examples of intermetallic compound-based, composite superconducting wire members having different structures from the above-mentioned one, a single diffusion barrier is provided in the stabilizer, or the individual filaments are surrounded by independent diffusion barriers, respectively. The individual intermetallic compound-base, composite superconducting wire members given above are used in coils for a relatively small electric current.

On the other hand, the necessary superconductor for use in superconducting coils for a nuclear fusion reactor is a conductor for generating a high magnetic field and carrying a large electric current such as more than 10 KA and more than 10 T, and thus it is composed from a plurality of the above-mentioned intermetallic compound-based, composite superconducting wire members.

Generally, a conductor for a high magnetic field and a large electric current comprises a plurality of the above-mentioned intermetallic compound-based, composite superconducting wire members which are stranded and which are provided in a conduit made from a high strength structural material, where a coolant passes through interstices between the plurality of the stranded wire members in the conduit to cool the conductor. Since the conductor for a high magnetic field and a large electric current is in a structure that a plurality of intermetallic compound-based, composite superconducting wire members are stranded and encased in a conduit, a large AC loss is generated by the coupling currents induced between the intermetallic compound-based, composite superconducting wire members.

The conventional alloy-based, composite superconducting wire member, for example, a NbTi-based composite superconducting wire member, requires no high temperature heat treatment, and thus the AC loss can be suppressed by applying an organic insulation to the surface of the wire member, whereas a conductor for a high magnetic field and a large electric current composed from a compound-based composite superconducting wire member requires a high temperature heat treatment, and thus it is hard to apply the organic insulation to the surface of the wire member. That is, there is such a disadvantage that the AC loss cannot be reduced.

Intermetallic compound-based, composite superconducting wire members, where the superconductive part is formed by heat treatment, are disclosed in Japanese patent applications Kokai (Laid-open) Nos. 59-191208 and 59-191213.

SUMMARY OF THE INVENTION

The present invention has been made considering the foregoing backgrounds, and an object of the present invention is to provide an intermetallic compound-based, composite superconductor with a small AC loss, using an intermetallic compound-based, composite superconducting wire member capable of forming a superconductive part by heat treatment.

The object of the present invention can be attained by providing a metal layer of high melting point and high resistance at the outermost periphery of a superconducting compound formed by diffusion reaction with the surrounding matrix, a stabilizer surrounding the matrix, and a diffusion barrier provided between the stabilizer and the matrix for preventing diffusion of superconductive compound-forming element into the stabilizer during the diffusion reaction.

DESCRIPTION OF THE PREFERRED EMBODIMENTS

The present invention will be described in detail below, referring to the embodiments shown in the accompanying drawings.

Figure 1:
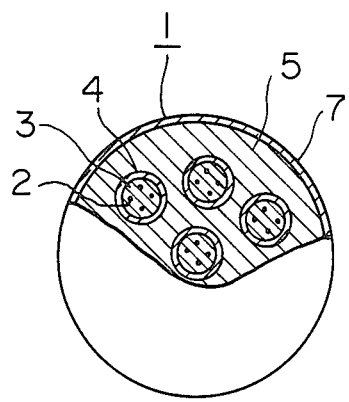
FIG. 1 is a partially cut-away view of an intermetallic compound-based, composite superconductor according to one embodiment of the present invention.

FIG. 1 shows one embodiment of the present invention, where superconductive elements each comprising a plurality of filaments 2 and a matrix 3, surrounded by a diffusion barrier 4 are distributed in a stabilizer 5, and a metal layer 7 of high melting point and high electrical resistance is provided at the outermost periphery of the stabilizer 5. Materials for the metal layer 7 of high melting point and high resistance include, for example, metals incapable of diffusing into the stabilizer 5 and contaminating the stabilizer during the heat treatment of the compound-based superconductor such as niobium (Nb), tantalum (Ta), vanadium (V), chromium (Cr), molybdenum (Mo), tungsten (W), etc.

In this structure, high temperature heat treatment can be made to conduct diffusion reaction, and insulation can be made owing to the provision of the metal layer of high melting point and high electrical resistance, so that the coupling current induced between the intermetallic compound-based superconducting wire members can be reduced, and the AC loss can be thus suppressed.

Figure 2:
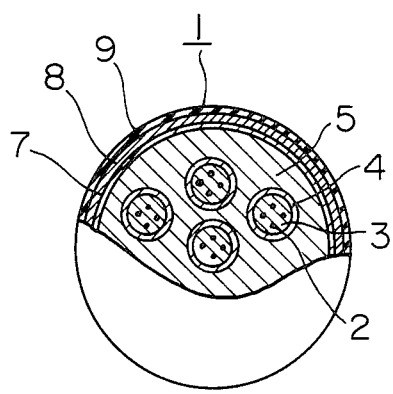
FIG. 2 is a partially cut-away view of an intermetallic compound-based, composite superconductor according to another embodiment of the present invention.

FIG. 2 shows another embodiment of the present invention, where another stabilizer 8 is further provided around the intermetallic compound-based, composite superconducting wire member according to the embodiment of FIG. 1, and the outer surface of the stabilizer 8 is chemically treated to form an electric insulating layer 9. Materials for the stabilizer 8 for this purpose include, for example, copper, aluminum, etc. which are easy to process when drawing the superconducting wire member. The chemical treatment of the surface of the stabilizer 8 is, for example, oxidation or sulfurization to form oxides such as CuO, $Al_2O_3$, etc., or sulfides such as CuS, etc.

In this structure, the AC loss of an intermetallic compound-based composite superconductor can be much more reduced to provide a stabilized, intermetallic compound-based, composite superconductor for a high magnetic field and a large electric current. That is, a large, intermetallic compound-based superconducting coil with a high stability even against a large fluctuation in the magnetic field can be prepared. As a result, an amount of expensive liquid helium can be considerably reduced. This means a distinguished economical advantage.

In the present intermetallic compound-based, composite superconductor, a metal layer of high melting point and high electrical resistance is provided at the outermost periphery of a strand comprising a plurality of filaments containing a superconductive compound formed by diffusion reaction with the surrounding matrix, a stabilizer surrounding the matrix, and a diffusion barrier provided between the stabilizer and the matrix for preventing diffusion of superconductive compound-forming element in the matrix into the stabilizer during the diffusion reaction, as described above, and thus the coupling current induced between the intermetallic compound-based superconducting wire members can be reduced by the provision of the metal layer of high melting point and high resistance. Furthermore, the superconductive parts can be formed by heat treatment, and the AC loss can be reduced thereby. These are the effects of the present invention.

What is claimed is:

1. An intermetallic compound-based, composite superconductor, which comprises a strand comprising a plurality of filaments containing a superconductive compound formed by diffusion reaction with a surrounding matrix, a stabilizer surrounding the matrix, and a diffusion barrier provided between the stabilizer and the matrix for preventing diffusion of superconductive compound-forming element into the stabilizer during the diffusion reaction, and a metal layer of high melting point and high electrical resistance being provided at the outermost periphery of the strand.

2. An intermetallic compound-based, composite superconductor according to claim 1, wherein the metal layer of high melting point and high electrical resistance is composed from a metal incapable of diffusing into the stabilizer and contaminating the stabilizer during the heat treatment of the intermetallic compound-based superconductor.

3. An intermetallic compound-based, composite superconductor according to claim 2, wherein the metal is selected from the group consisting of niobium, tantalum, vanadium, chromium, molybdenum and tungsten.

4. An intermetallic compound-based, composite superconductor, which comprises a strand comprising a plurality of filaments containing a superconductive compound formed by diffusion reaction with a surrounding matrix, a first stabilizer surrounding the matrix, and a diffusion barrier provided between the stabilizer and the matrix for preventing diffusion of superconductive compound-forming element into the stabilizer during the diffusion reaction, a metal layer of high melting point and high electrical resistance being provided at the outermost periphery of the strand, and a layer of a second stabilizer being further provided at the outer periphery of the metal layer of high melting point and high electrical resistance, and provided with an electric insulating layer formed on the outer surface thereof by chemical treatment.

5. An intermetallic compound-based, composite superconductor according to claim 4, wherein the second stabilizer comprises of a material selected from the group consisting of copper and aluminum.

6. An intermetallic compound-based, composite superconductor according to claim 4, wherein the layer of the second stabilizer is oxidized or sulfurized as the chemical treatment, thereby forming an oxide or a sulfide as the electric insulating layer.

* * * * *